United States Patent
Benzel et al.

(10) Patent No.: US 7,572,660 B2
(45) Date of Patent: Aug. 11, 2009

(54) ELECTRICAL THROUGH-PLATING OF SEMICONDUCTOR CHIPS

(75) Inventors: Hubert Benzel, Pliezhausen (DE); Stefan Finkbeiner, Gomaringen (DE); Christoph Schelling, Reutlingen (DE); Julian Gonska, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 75 days.

(21) Appl. No.: 11/016,617

(22) Filed: Dec. 17, 2004

(65) Prior Publication Data

US 2005/0133880 A1 Jun. 23, 2005

(30) Foreign Application Priority Data

Dec. 17, 2003 (DE) ................. 103 59 217

(51) Int. Cl.
*H01L 21/00* (2006.01)
(52) U.S. Cl. .............. 438/53; 438/50; 438/52; 438/514; 438/659; 257/415; 257/417; 257/419; 257/E21.481
(58) Field of Classification Search ........ None See application file for complete search history.

(56) References Cited

U.S. PATENT DOCUMENTS

| | | | | |
|---|---|---|---|---|
| 5,202,281 A | * | 4/1993 | Ishibashi | 438/52 |
| 5,879,572 A | * | 3/1999 | Folsom et al. | 216/49 |
| 5,994,161 A | * | 11/1999 | Bitko et al. | 438/53 |
| 6,030,851 A | * | 2/2000 | Grandmont et al. | 438/53 |
| 6,287,885 B1 | * | 9/2001 | Muto et al. | 438/48 |
| 6,417,021 B1 | * | 7/2002 | Vigna et al. | 438/53 |
| 6,682,649 B1 | * | 1/2004 | Petersen et al. | 205/777.5 |
| 6,768,291 B2 | * | 7/2004 | Isogai et al. | 324/71.1 |
| 6,971,266 B2 | * | 12/2005 | Kawai | 73/204.26 |
| 2004/0104454 A1 | * | 6/2004 | Takaoka et al. | 257/621 |

FOREIGN PATENT DOCUMENTS

| | | |
|---|---|---|
| DE | 100 42 945 | 3/2002 |
| DE | 100 58 864 | 6/2002 |

* cited by examiner

*Primary Examiner*—Zandra Smith
*Assistant Examiner*—Khanh B Duong
(74) *Attorney, Agent, or Firm*—Kenyon & Kenyon LLP

(57) ABSTRACT

A method for manufacturing a micromechanical component and a micromechanical component manufactured using this method are described, the micromechanical component having a first substrate, which in turn has at least one cavity and one printed conductor. At least a part of the printed conductor is applied to at least a part of the walls of the cavity. In particular, the floor of the cavity is considered part of the cavity walls.

12 Claims, 3 Drawing Sheets

ELECTRICAL THROUGH-PLATING OF SEMICONDUCTOR CHIPS

FIELD OF THE INVENTION

The present invention relates to a method for manufacturing a micromechanical component and to a micromechanical component manufactured according to this method, the micromechanical component having at least one substrate having a cavity and a printed conductor.

BACKGROUND INFORMATION

Sensor elements and analyzer circuits of micromechanical sensors are frequently manufactured in different microelectronic and/or micromechanical components and housed in a housing. In order to connect the different components to one another and/or to the housing, different bonding methods (e.g., wirebonding method, bond pads) or generally a flip-chip technology are used for electrical contacting. To implement long-lasting and functional connections, high requirements are necessary for the packaging and interconnection technology. Thus, it is to be ensured in flip-chip technology that the contacting side of a substrate chip which contains the sensor elements does not have any fragile structures which may be destroyed when the substrate chip is placed on the carrier substrate.

A method for tailoring the contacting of a sensor element with an integrated circuit in a housing is described in the document German Published Patent Application No. 103 50 551 (not a prior publication).

A sensor which has both a sensor element and parts of the analyzer circuit on the same substrate is described in the document German Published Patent Application No. 103 47 215, which is also not a prior publication.

A further possibility for integrating the sensor elements and the readout circuit in one component is described in German Published Patent Application No. 100 42 945 and in German Published Patent Application No. 100 58 864. In the component suggested therein, a sensor element is positioned vertically in relation to the readout electronics. In DE 100 42 945 A1, the sensor element and the readout electronics are separated from one another by a cavity having support structures, the support structures simultaneously representing an electrical connection between the sensor element and the readout circuit.

In contrast, German Published Patent Application No. 100 58 864 describes a micromechanical structure for integrated sensor systems, in which different layer sequences are applied to a substrate and processed. Through selective etching of the applied layers, metal structures are produced which are used for support of the micromechanical structure and for electrical contacting of the readout electronics situated vertically underneath the sensor structure.

SUMMARY OF THE INVENTION

The present invention is directed to a method for manufacturing a micromechanical component and to a micromechanical component manufactured using this method, the micromechanical component having a first substrate, which in turn has at least one cavity and one printed conductor. The core of the present invention is that at least one part of the printed conductor is applied to at least one part of the walls of the cavity. In this case, the floor of the cavity is considered part of the cavity walls in particular.

Using the present invention, integration of multiple printed conductors in a cavity is advantageously made possible. Furthermore, the contacting of multiple substrate chips which are stacked on top of one another and connected to one another is possible. Furthermore, smaller substrate chips and thus smaller chip packages are possible by positioning the contacting areas on the substrate back.

In one embodiment of the present invention, different, in particular microelectronic and/or micromechanical elements are applied to the front and the back of the first substrate. Thus, at least one diaphragm and/or one part of the printed conductor and/or one electric circuit is applied to the front of the first substrate. In contrast, at least one cavity, one part of the printed conductor, and/or one contact area is produced on the back of the first substrate.

An electrical contact which allows an electrical connection from the substrate front to the substrate back is advantageously produced in the first substrate. This electrical contact may be implemented as part of the diaphragm. One possibility for manufacturing an electrical contact of this type is to manufacture the diaphragm from a semiconductor material and to produce a doped conductive region within the diaphragm. In addition, it is also possible for the electrical contact to run entirely outside the diaphragm in the first substrate.

In a particular refinement of the present invention, a second layer is applied to the substrate back. In order to achieve the most uniform and homogeneous coverage possible of the cavity walls, a spray method or electrodeposition of charged droplets is provided, for example.

Through coverage of this type, the coating may follow any irregularities on the cavity wall (including the cavity floor) or the substrate. The second layer advantageously has a light-dependent behavior for further process steps in the manufacturing method of the micromechanical component. In particular, upon illumination of this second layer, the focus, i.e., the focal point of the incident light, is on the floor of the cavity. The printed conductor may be structured with the aid of this second layer.

In a further embodiment of the present invention, a second substrate is applied to the first substrate. The two substrates may be connected in the course of the manufacture of the micromechanical component via a bonding process, a bonding process being understood as direct bonding of the two substrates onto one another. A further possibility for manufacturing an electrical connection from the first substrate to the second substrate is to position at least one contact area or one printed conductor on the first substrate in such a way that an electrical connection to corresponding electrically conductive connection points on the second substrate is produced when the second substrate is applied. Optionally, a metal layer may also be applied to one of the two substrates to produce an electrical connection. Advantageously, the first substrate has at least one sensor element and the second substrate has at least one part of an integrated circuit.

To manufacture the micromechanical component, at least one insulation layer is deposited onto the front of the first substrate in order to insulate the substrate from a first layer, which is also applied to the front of the substrate. In a further embodiment of the present invention, the insulation layer may additionally be used as the etch-stop layer when the cavity is etched out from the back of the first substrate. A further method step is for printed conductor structures to be applied to the back of the first substrate, through a photolithographic method, for example. In this case, at least part of the printed conductor structures are produced on the walls of the cavity. An electrical contact is produced through the first substrate to electrically connect electrical elements on the front to the printed conductors on the back of the substrate.

At least one integrated circuit, as part of an analyzer circuit, for example, and/or a printed conductor is advantageously produced and/or manufactured on the front of the first substrate using a structuring method. If a first layer is deposited on the first substrate to manufacture the micromechanical component, in a particular embodiment of the present invention, the integrated circuit and/or the printed conductor is produced in the first layer. In contrast, if a second substrate is applied to the first substrate, the integrated circuit and/or the printed conductor is produced on the surface of the substrate, which is now to be counted as the second substrate from the first substrate.

In a preferred embodiment of the present invention, the at least one printed conductor which is located on the substrate is electrically insulated from the first substrate by an insulation layer. For example, $SiO_2$ or silicon nitride may be provided as the material for this insulation layer.

In a particular refinement of the present invention, at least two printed conductors which are electrically insulated from one another are produced in the at least one cavity in the first substrate. In this case, only one of the printed conductors may optionally have an electrical contact from the back to the front of the substrate.

In a particular embodiment of the present invention, a substrate chip is described which has circuit elements on the chip front, in a separately manufactured device layer, for example, and has a cavity on the back. A diaphragm is located in the cavity region between the cavity floor and the chip front. This diaphragm has printed conductors which allow electrical contact of the circuit elements in the device layer to the cavity floor. The size of the cavity and the angle between the cavity sides and the surface of the substrate back is arbitrary in this case, so that different etching methods may be used to produce the cavity. In a particular embodiment of the present invention, the printed conductors in the cavity region are made of doped silicon or a metal. Printed conductors, which connect the electrical contacts on the diaphragm to the substrate back, are located on a part of the cavity walls and/or the cavity sides. The printed conductors on the cavity sides and/or the cavity floor and on the substrate back may be structured using an appropriate lithographic method. An insulation layer, which must be opened at the points of the electrical through-plating, is located under the printed conductor on the cavity sides, the substrate back, and on the cavity floor. Alternatively to this, the substrate chip itself may be made of an insulating material. The printed conductors are structured in such a way that they have contact areas on the substrate back or substrate front, which may be bonded to a substrate lying below and/or above using a suitable method.

BRIEF DESCRIPTION OF THE DRAWINGS

FIGS. 2 through 5a show different embodiments of substrates in which at least one layer or a further substrate has been applied onto the base substrate, which contains the cavity.

DETAILED DESCRIPTION

The structure and function of the method according to the present invention for through-plating within a substrate and/or substrate chip from the substrate front to the substrate back and manufacturing printed conductors on the cavity walls of the substrate will be described on the basis of FIGS. 1 through 5.

Figure 1A:
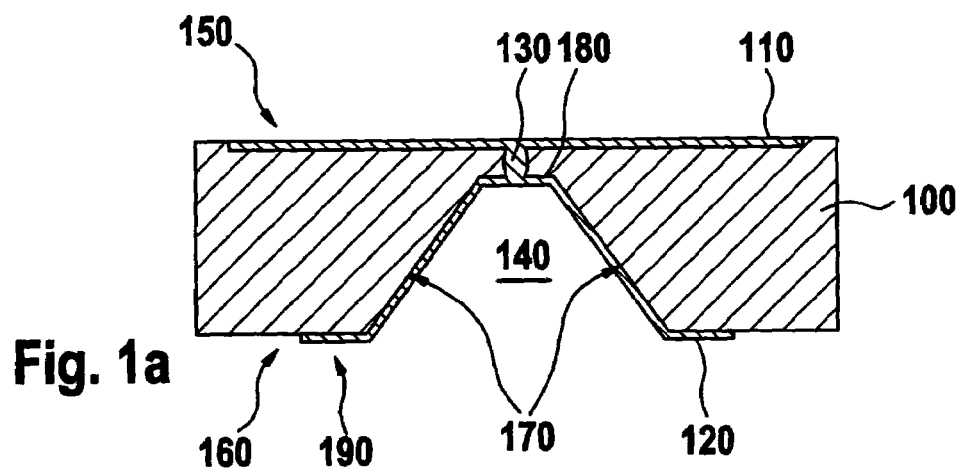
FIG. 1a shows a cross section through a substrate having a design according to the present invention of the printed conductors on the cavity walls of an anisotropically etched cavity.

FIG. 1a shows a first exemplary embodiment of a substrate 100, which has a cavity 140 on substrate back 160, which was etched anisotropically using a potassium hydroxide solution, for example. The angle between sides 170 and the substrate plane is typically 54.7° with etching of this type using a KOH solution in a (100) wafer. In addition, however, other etching processes, which may produce a cavity 140 in an insulator and/or in a weakly conducting substrate 100 in particular, are also conceivable. Cavity floor 180 defines the diaphragm with the corresponding region in the substrate. Using doping, through-plating 130 from the diaphragm top to the diaphragm bottom is produced on and/or in the diaphragm. However, through-plating 130 may also be produced via another method. Thus, it is conceivable that an etch-stop layer is applied to cavity floor 180 and an opening is produced through the diaphragm using a trench method, for example. This opening may be closed using a conductive material in a further step.

In addition to the production of through-plating 130, printed conductors 110 and/or 120 are applied to both substrate front 150 and substrate back 160. In this case, printed conductors 110 are preferably structured on substrate front 150, while printed conductors 120 may be both structured and deposited over the entire surface on substrate back 160. In addition to printed conductors, contact areas 190 may also be produced on substrate back 160, which may be used for further contact to a housing or to a further substrate, for example. Printed conductors 120 are produced in particular on the cavity walls, which allow an electrical connection from through-plating 130, i.e., from the diaphragm top to the diaphragm bottom, to substrate back 160 having printed conductors and/or contact areas 190 located thereon. It is to be noted here that in the following both cavity sides 170 and cavity floor 180 are to be understood as the cavity walls.

A possibility for producing printed conductors 120 and/or contact areas 190 on substrate back 160 and on cavity walls 170 and 180 is to structure one or more printed conductors for contacting substrate front 150 to substrate back 160 in cavity 140 using a lithographic method. If an insulation layer 200 is located on substrate back 160, it must be opened before the metal plating is deposited in the region of the electrical through-plating. The lithographic method described in the following may be used for this purpose.

In the course of the lithographic method, a (photo)resist layer which is as homogeneous as possible is applied, using spray painting, for example, with a sufficient thickness onto substrate back 160, cavity sides 170, and cavity floor 180. A further possibility for applying a photosensitive layer is to use electrodeposition. In this case, the photosensitive material is made of charged particles which are deposited onto the surface in a coating process. As the charged particles of the photosensitive material accumulate on the surface, they are electrically neutralized and form a photosensitive layer.

Subsequent exposure to light of the (photo)resist layer, i.e., the photosensitive layer is designed in such a way that the focus of the light beam is on cavity floor 180, since the highest structure resolution is necessary here. The increasing fuzziness on cavity sides 170 and on substrate back 160 may be neglected because of the increasing distance of the printed conductors from one another. This will be described in greater detail in the following with reference to FIG. 5b. The limiting factor for the number of different printed conductors in a cavity is the cavity size and/or the resolution of the lithographic method.

Care is to be taken in the selection of the exposure method that the cavity walls in particular are coated with the photoresist layer, i.e., a photosensitive layer in such a way that the layer thus produced follows small irregularities on the surface of the substrate and/or the cavity walls. Only thus is it ensured that the printed conductors allow sufficiently good electrical connections from the substrate front to the substrate back.

Figure 1B:
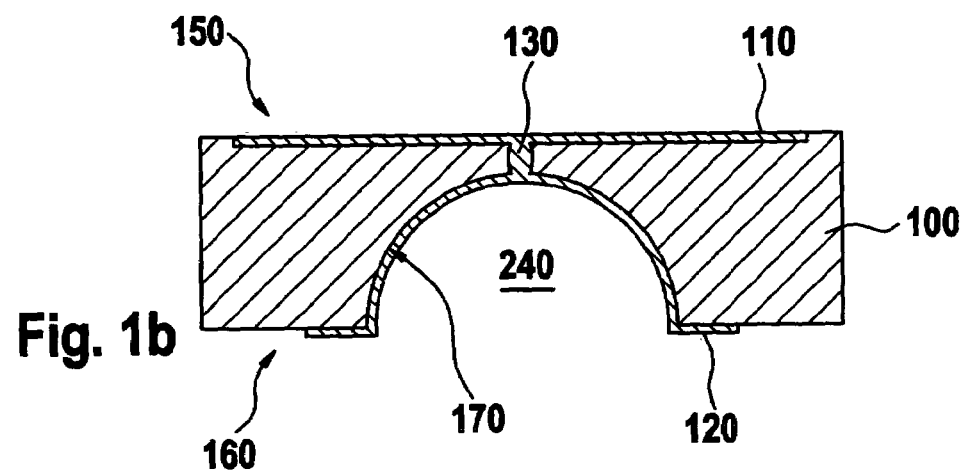
FIG. 1b shows a comparable cross section through a substrate which has an isotropically etched cavity.

As is shown on the basis of FIG. 1b, the method according to the present invention may also be applied in a cavity 240 manufactured using an isotropic etching method. Alternatively to FIGS. 1a and 1b, a substrate 100 which has more than one cavity may also be provided. Each cavity may have a printed conductor and/or a part of a printed conductor in this case, but this is not absolutely necessary. Rather, only a specific proportion of the cavities, at specific points which have been marked through the structuring on substrate front 150, for example, may be provided with printed conductors. Furthermore, it is conceivable to select the cavities which are provided with printed conductors and through-plating 130 using a geometric pattern on the substrate.

Figure 2:
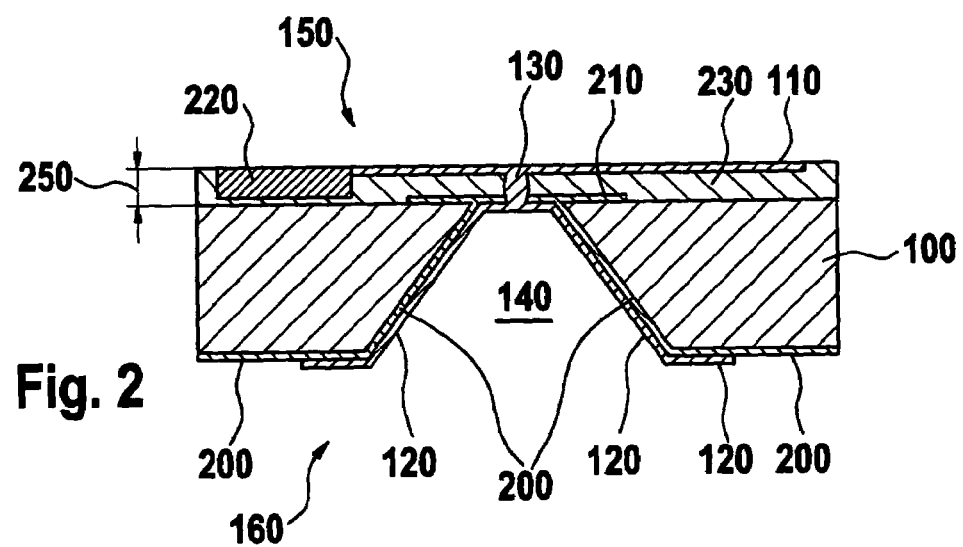

It is assumed in the exemplary embodiments of FIG. 1a and FIG. 1b that the substrate is an insulator or an at least weakly conductive material. However, if a material which has a non-negligible electrical conductivity is used as the substrate (e.g., doped silicon), care is to be taken that printed conductors 110 and 120 and through-plating 130 are electrically insulated from substrate 100. This may be performed, for example, by applying an insulation layer between substrate 100 and printed conductors 110 and 120. A possible embodiment of a construction of this type is shown in FIG. 2. In this case, an insulation layer 200, made of silicon dioxide or silicon nitride, for example, may be applied to substrate back 160 and structured before printed conductors 120 are deposited. Furthermore, it is also possible to apply an insulation layer 210 to substrate front 150, which may be used as an etch-stop layer or as insulation from a printed conductor in the subsequent etching process for producing cavity 140. A uniform, i.e., homogeneous depth of all cavities over the substrate wafer may thus be ensured during the manufacture of multiple cavities in substrate 100 through an etch-stop layer.

An epitaxial layer 250 may be applied to structurable layer 210 in a further process step. If layer 210 is a silicon dioxide layer and the epitaxial material is polysilicon, monocrystalline silicon, onto which a circuit 220 may be integrated, is obtained during the epitaxy on the surface regions of substrate front 150 which are not covered by oxide. To electrically connect integrated circuit 220, which is manufactured in a further process step, to through-plating 130, at least one printed conductor 110 is applied to the newly obtained surface of the substrate.

A further embodiment includes using an SOI wafer having an oxide layer over the entire surface.

Figure 3:
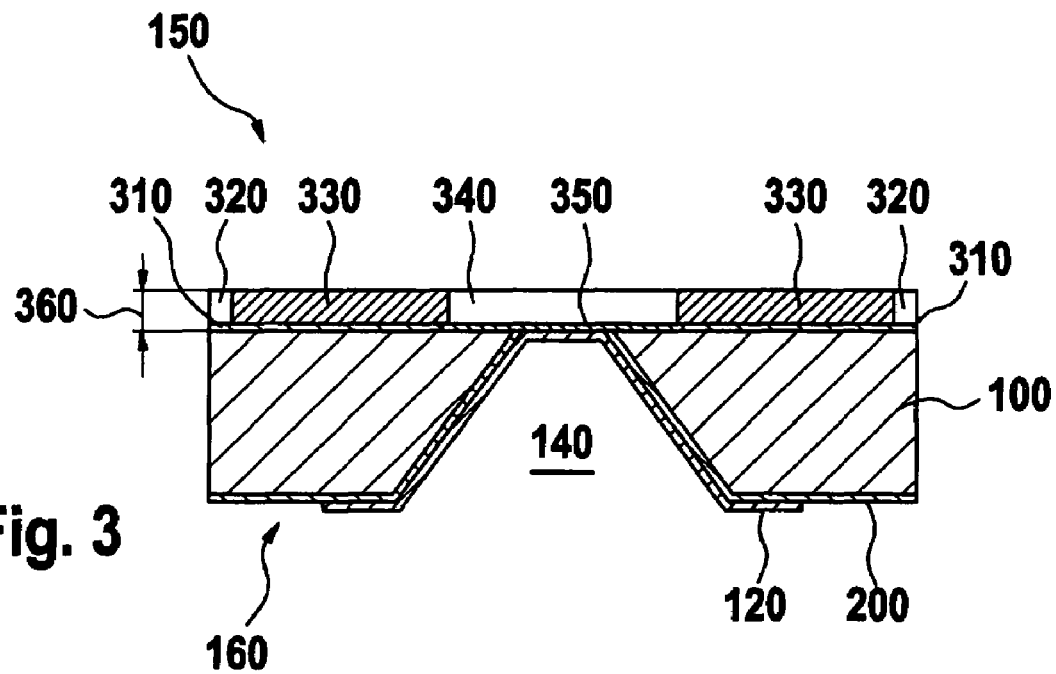

In a further exemplary embodiment of the present invention, a metal layer 350 may also be deposited onto the substrate wafer instead of an insulation layer 210. This metal layer 350 may also be structured suitably, one approach to which is shown in FIG. 3. In order to achieve a uniform surface over the entire substrate surface, a further layer 310 may be deposited on substrate 100. This is preferably an insulation layer. In a further process step, a second substrate and/or a further substrate wafer may be applied to the planarized surface thus produced, which includes layer 310 and metal layer 350. In a preferred exemplary embodiment, this second substrate is used as device wafer 360; device wafer 360 may have pre-manufactured switching elements 330, recesses 340, or other structures 320. The substrate is favorably applied in such a way that metal layer 350 produces both an electrical connection of switching elements 330 to the substrate front and an electrical contact to printed conductors 120 on the cavity walls and/or on substrate back 160.

Figure 4:
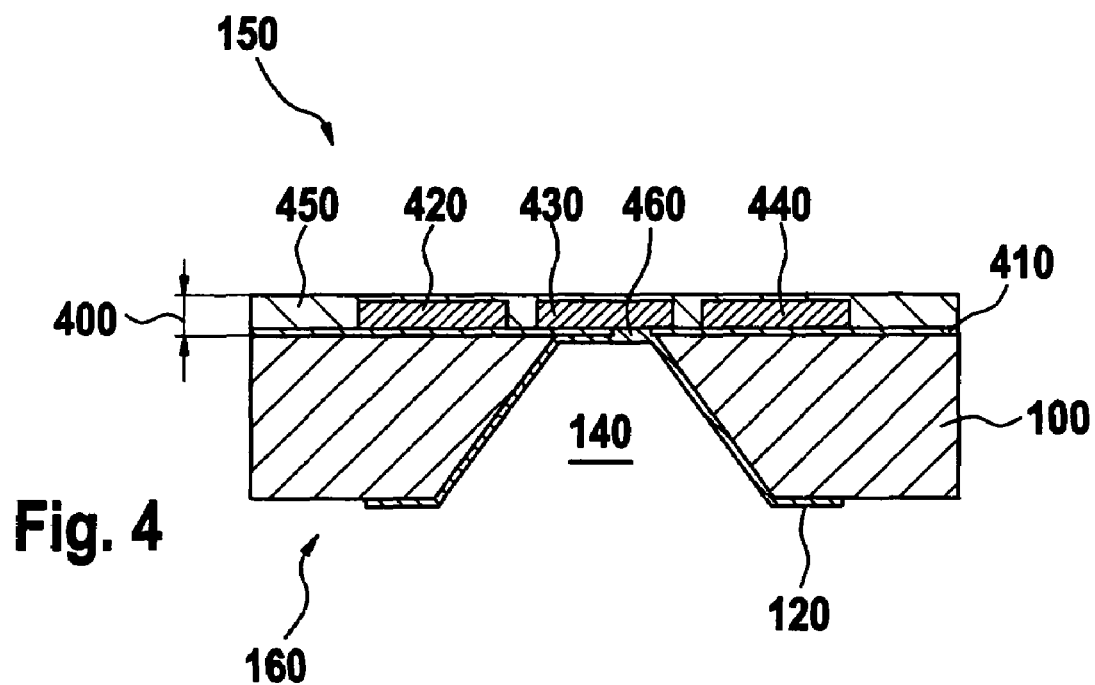

Different materials may be used as substrate material 100, i.e., bulk material. Examples of these are silicon, photostructurable glasses, indium tin oxide, or quartz substrates. As shown in FIG. 4, silicon may then be bonded to the substrate as device layer 400 and lapped back. Here, as shown in the exemplary embodiment of FIG. 3, the device layer may also contain different pre-manufactured structured switching elements 420, 430, and 440, which are at least partially connected to the substrate back via printed conductor 120. Furthermore, an insulation layer 410 is provided, which ensures that electrical connection between the two substrates is only possible at intended contact points 460.

When a device layer 360 and/or 400 is applied, the printed electrical conductors and/or contacts on substrate surface 160 may be used for the purpose of producing an electrical connection from substrate 100 to the device layer. However, it is necessary for this purpose to adjust the structuring of the printed conductors and/or contact areas on the surface of the substrate front to the printed conductors and/or contact areas on the bottom of device layer 360 or 400. Furthermore, care is to be taken that device layer 360 or 400 is solidly connected to substrate 100 in order to ensure good electrical contact between the two components, even in the event of possible mechanical strain. Possible connection technologies for this purpose are bonding or gluing of the components, for example.

Figure 5A:
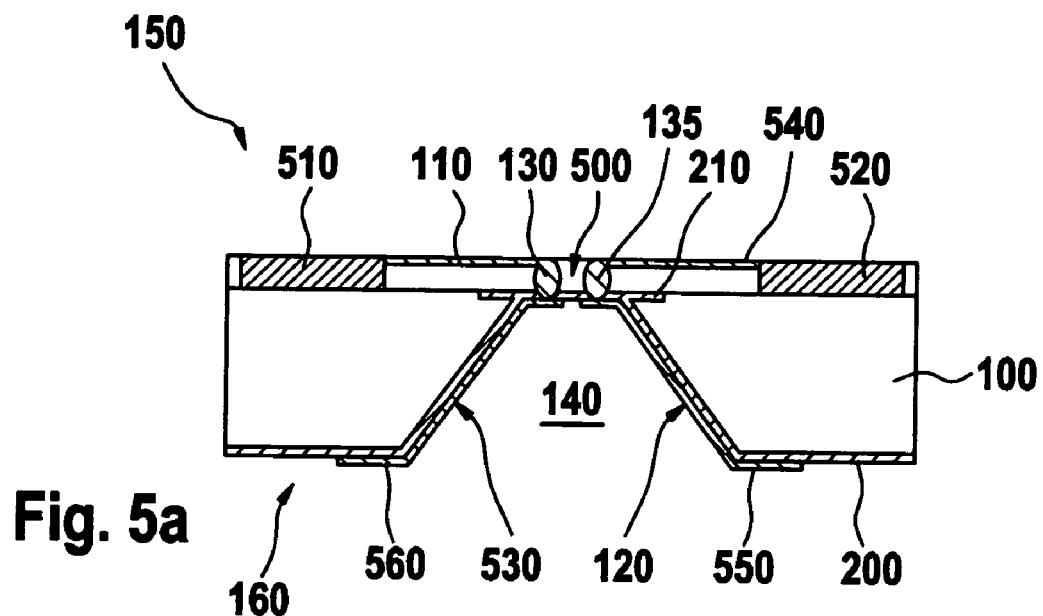
Figure 5B:
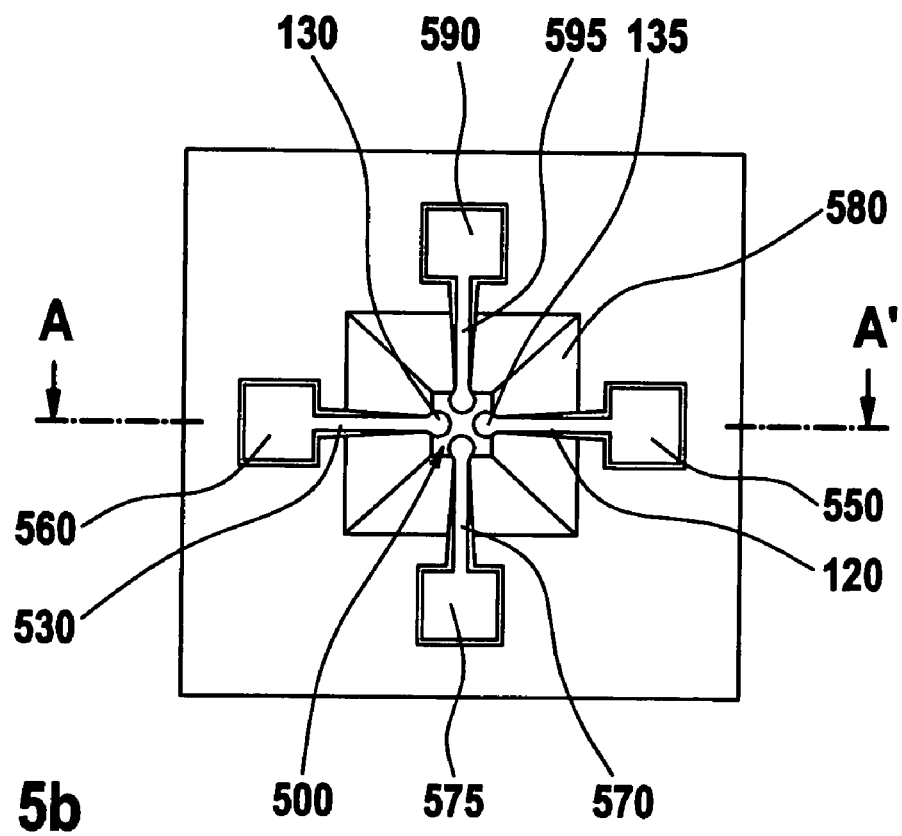
FIG. 5b shows the view from the back of substrate 5a with the printed conductors on the walls of the cavity.

The possible embodiment of multiple printed conductors on the cavity walls in a substrate 100 is shown on the basis of FIGS. 5a and 5b, FIG. 5a showing a cross section along line AA' in FIG. 5b. In this case, each circuit element is assigned its own through-plating, a printed conductor, and a contact area. Thus, for example, circuit element 510 is electrically connected via a printed conductor 110 on substrate front 150 using through-plating 130 to printed conductor 530 on the corresponding side of cavity 140 and contact area 560. The system made of circuit element 520, printed conductor 540, through-plating 135, printed conductor 120, and contact area 550 is comparable therewith. As already shown on the basis of FIG. 2, printed conductors 120 and 530 may be electrically insulated from one another by an insulation layer 200 and/or by an insulation layer 210 used as an etch-stop layer.

To illustrate how multiple printed conductors and contact areas may be positioned on the cavity walls and/or on the substrate back, a view of the substrate back of the substrate from FIG. 5a is shown in FIG. 5b, which has been expanded to four contact areas to illustrate a more complex structuring. Each of the contact areas on the substrate back is electrically connected to the substrate front using a printed conductor and a through-plating. Thus, for example, contact area 575 is in electrical contact with printed conductor 595 via printed conductor 570 and contact area 590. As may be seen in FIG. 5b, printed conductors 120, 530, 570, and 595 run at least partially on cavity walls 580. Printed conductors 120, 530, 570, 595 are connected on cavity floor 500 to through-platings (among others, 130 and 135), which produce an electrical contact to the substrate front. Since the smallest structure dimensions are necessary on cavity floor 500 in order to insulate the electrical contacts from one another, the light is focused on cavity floor 500 during the exposure upon which the structuring is based.

Since the exposure of the photosensitive layer becomes fuzzier with increasing distance from the focal plane in focusing of this type, the structures on the substrate back, i.e., contact areas 550, 560, 575, and 590 and parts of the printed conductors are only imaged fuzzily. However, since the contact areas and the printed conductors are further apart from one another on the substrate back in comparison to cavity floor 500, this fuzzy imprinting of the structures at these points has no negative consequences.

In addition, using contact areas 550, 560, 575, and 590 and/or using correspondingly structured printed conductors on the substrate back, the installation of the micromechanical component thus manufactured into a housing may be made easier, since no complex wiring from one side of the component to the other side is necessary. As is already the case in the connection between two components, a bonding method or a gluing method may also be used for the attachment and contacting of the micromechanical component in a housing for further processing.

Using the manufacturing method according to the present invention, manifold sensor elements may be manufactured. Thus, for example, it is conceivable for the diaphragm described to be used as part of a pressure sensor or an air mass sensor. Furthermore, it is possible to apply a suitable structure onto the chip and/or the diaphragm for measuring accelerations or yaw rates.

What is claimed is:

1. A method for manufacturing a micromechanical component including a first substrate, the first substrate including at least one cavity and at least one printed conductor, comprising:
   applying at least a part of the at least one printed conductor to at least a part of walls of the cavity;
   one of producing and applying at least one of a diaphragm, a part of the at least one printed conductor, and an electrical circuit on a front of the first substrate;
   one of producing and applying at least one of the cavity, a part of the at least one printed conductor, and a contact area on a back of the first substrate; and
   producing an electrical contacting in the first substrate from the front to the back of the first substrate, wherein at least one of:
      the electrical contacting is implemented as part of the diaphragm, and
      the electrical contacting is produced as a doped region in the diaphragm, the diaphragm being made of a semiconductor material;
   wherein a diaphragm is produced and applied, and at least one of a part of the at least one printed conductor and an electrical circuit are produced and applied on a front of the first substrate, wherein the diaphragm deforms to sense a physical parameter.

2. The method as recited in claim 1, further comprising:
   applying a second substrate including at least one integrated circuit to the first substrate by at least one of:
      bonding the first substrate and the second substrate, and
      producing an electrical connection from the first substrate to the second substrate via at least one of:
         one of a contact area and a printed conductor of the first substrate, and
         an additional metal layer applied to one of the first substrate and the second substrate.

3. The method as recited in claim 1, further comprising:
   depositing an insulation layer on at least one of the front and the back of the first substrate;
   applying a first layer containing one of a semiconducting material and a metallic material to the front of the first substrate;
   etching the cavity from the back of the first substrate up to the insulation layer;
   applying a printed conductor structure to the back of the first substrate, at least a part of the printed conductor structure being produced on the walls of the cavity; and
   producing an electrical contacting through the first substrate from the back of the first substrate to the front of the first substrate.

4. The method as recited in claim 3, further comprising:
   at least one of producing and structuring on the front of the first substrate at least one of an integrated circuit and a printed conductor, the at least one of the integrated circuit and the printed conductor being produced in the first layer.

5. The method as recited in claim 1, further comprising:
   electrically insulating the at least one printed conductor from the first substrate by an insulation layer including one of SiOx and silicon nitride.

6. A method for manufacturing a micromechanical component including a first substrate, the first substrate including at least one cavity and at least one printed conductor, comprising:
   applying at least a part of the at least one printed conductor to at least a part of walls of the cavity;
   providing at least one of a diaphragm, a part of the at least one printed conductor, and an electrical circuit on a front of the first substrate;
   providing at least one of the cavity, a part of the at least one printed conductor, and a contact area on a back of the first substrate; and
   providing an electrical contacting in the first substrate from the front to the back of the first substrate, wherein the electrical contacting is implemented as part of the diaphragm, and an opening for the electrical contacting is formed in the diaphragm by using trenching;
   wherein a diaphragm is produced and applied, and at least one of a part of the at least one printed conductor and an electrical circuit are produced and applied on a front of the first substrate, wherein the diaphragm deforms to sense a physical parameter.

7. The method as recited in claim 6, further comprising:
   applying a light-sensitive second layer to a back of the first substrate, the light-sensitive second layer producing a homogeneous covering of the cavity walls as much as possible, wherein the light-sensitive second layer is applied by at least one of:
      a spray process,
      an electrodeposition,
      focusing a light on a floor of the cavity during a subsequent exposure of the light-sensitive second layer, and
      structuring the light-sensitive second layer to the at least one printed conductor.

8. The method as recited in claim 6, wherein:
   the at least one printed conductor includes at least two printed conductors that are electrically insulated from one another and are produced in the at least one cavity, an electrical contacting being produced from a back to a front of the first substrate.

9. A method for manufacturing a micromechanical component including a first substrate, the first substrate including at least one cavity and at least one printed conductor, comprising:
  applying at least a part of the at least one printed conductor to at least a part of walls of the cavity;
  one of producing and applying at least one of a diaphragm, a part of the at least one printed conductor, and an electrical circuit on a front of the first substrate;
  one of producing and applying at least one of the cavity, a part of the at least one printed conductor, and a contact area on a back of the first substrate; and
  producing an electrical contacting in the first substrate from the front to the back of the first substrate, wherein at least one of:
    the electrical contacting is implemented as part of the diaphragm, and the electrical contacting is produced as a doped region in the diaphragm, the diaphragm being made of a semiconductor material;
    applying a second substrate including at least one integrated circuit to the first substrate by a least one of:
      bonding the first substrate and the second substrate, and producing an electrical connection from the first substrate to the second substrate via at least one of:
        one of a contact area and a printed conductor of the first substrate, and
        an additional metal layer applied to one of the first substrate and the second substrate; and
  electrically insulating the at least one printed conductor from the first substrate by an insulation layer including one of SiOx and silicon nitride;
  wherein a diaphragm is produced and applied, and at least one of a part of the at least one printed conductor and an electrical circuit are produced and applied on a front of the first substrate, wherein the diaphragm deforms to sense a physical parameter.

10. A method for manufacturing a micromechanical component including a first substrate, the first substrate including at least one cavity and at least one printed conductor, comprising:
  applying at least a part of the at least one printed conductor to at least a part of walls of the cavity;
  one of producing and applying at least one of a diaphragm, a part of the at least one printed conductor, and an electrical circuit on a front of the first substrate;
  one of producing and applying at least one of the cavity, a part of the at least one printed conductor, and a contact area on a back of the first substrate; and
  producing an electrical contacting in the first substrate from the front to the back of the first substrate, wherein at least one of:
    the electrical contacting is implemented as part of the diaphragm, and the electrical contacting is produced as a doped region in the diaphragm, the diaphragm being made of a semiconductor material;
  depositing an insulation layer on at least one of the front and the back of the first substrate;
  applying a first layer containing one of a semiconducting material and a metallic material to the front of the first substrate;
  etching the cavity from the back of the first substrate up to the insulation layer;
  applying a printed conductor structure to the back of the first substrate, at least a part of the printed conductor structure being produced on the walls of the cavity;
  producing an electrical contacting through the first substrate from the back of the first substrate to the front of the first substrate;
  at least one of producing and structuring on the front of the first substrate at least one of an integrated circuit and printed conductor, the at least one of the integrated circuit and the printed conductor being produced in the first layer; and
  electrically insulating the at least one printed conductor from the first substrate by an insulation layer including one of SiOx and silicon nitride;
  wherein a diaphragm is produced and applied, and at least one of a part of the at least one printed conductor and an electrical circuit are produced and applied on a front of the first substrate, wherein the diaphragm deforms to sense a physical parameter.

11. A method for manufacturing a micromechanical component including a first substrate, the first substrate including at least one cavity and at least one printed conductor, comprising:
  applying at least a part of the at least one printed conductor to at least a part of walls of the cavity;
  providing at least one of a diaphragm, a part of the at least one printed conductor, and an electrical circuit on a front of the first substrate;
  providing at least one of the cavity, a part of the at least one printed conductor, and a contact area on a back of the first substrate; and
  providing an electrical contacting in the first substrate from the front to the back of the first substrate, wherein the electrical contacting is implemented as part of the diaphragm, and an opening for the electrical contacting is formed in the diaphragm by using trenching;
  applying a light-sensitive second layer to a back of the first substrate, the light-sensitive second layer producing a homogeneous covering of the cavity walls as much as possible, wherein the light-sensitive second layer is applied by at least one of:
    a spray process,
    an electrodeposition,
    focusing a light on a floor of the cavity during a subsequent exposure of the light-sensitive second layer, and
    structuring the light-sensitive second layer to the at least one printed conductor;
  wherein a diaphragm is produced and applied, and at least one of a part of the at least one printed conductor and an electrical circuit are produced and applied on a front of the first substrate, and wherein the diaphragm deforms to sense a physical parameter.

12. The method as recited in claim 11, further comprising:
  electrically insulating the at least one printed conductor from the first substrate by an insulation layer including one of SiOx and silicon nitride;
  wherein the at least one printed conductor includes at least two printed conductors that are electrically insulated from one another and are produced in the at least one cavity, an electrical contacting being produced from a back to a front of the first substrate.

* * * * *

UNITED STATES PATENT AND TRADEMARK OFFICE
CERTIFICATE OF CORRECTION

PATENT NO. : 7,572,660 B2  Page 1 of 1
APPLICATION NO. : 11/016617
DATED : August 11, 2009
INVENTOR(S) : Benzel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 218 days.

Signed and Sealed this

Seventh Day of September, 2010

David J. Kappos
*Director of the United States Patent and Trademark Office*